United States Patent
Yu et al.

(10) Patent No.: US 8,098,364 B2
(45) Date of Patent: Jan. 17, 2012

(54) EXPOSURE APPARATUS AND METHOD FOR PHOTOLITHOGRAPHY PROCESS

(75) Inventors: Vinvent Yu, Taichung County (TW); Hsien-Cheng Wang, Hsinchu (TW); Hung-Chang Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 489 days.

(21) Appl. No.: 11/875,471

(22) Filed: Oct. 19, 2007

(65) Prior Publication Data
US 2009/0103068 A1  Apr. 23, 2009

(51) Int. Cl.
G02F 1/29 (2006.01)
G03B 27/32 (2006.01)
G03B 27/42 (2006.01)
G03B 27/52 (2006.01)
G03B 27/54 (2006.01)
G03B 27/72 (2006.01)

(52) U.S. Cl. ........... 355/55; 355/53; 355/67; 355/71; 355/77; 359/319

(58) Field of Classification Search .......... 355/53, 355/55, 56, 67, 71, 77; 359/315, 319
See application file for complete search history.

(56) References Cited

U.S. PATENT DOCUMENTS

| | | | |
|---|---|---|---|
| 4,474,463 A | 10/1984 | Heimer | |
| 4,859,041 A | 8/1989 | Suda | |
| 5,541,761 A * | 7/1996 | Shibaguchi | 359/216.1 |
| 6,304,316 B1 * | 10/2001 | Jain et al. | 355/53 |
| 6,387,597 B1 | 5/2002 | Gelbart | |
| 7,196,723 B2 | 3/2007 | Kinoshita et al. | |
| 7,200,075 B2 | 4/2007 | Tada et al. | |
| 7,248,337 B2 | 7/2007 | Teunissen et al. | |
| 2002/0048857 A1 | 4/2002 | Saito et al. | |
| 2005/0007572 A1 * | 1/2005 | George et al. | 355/55 |
| 2005/0030438 A1 * | 2/2005 | Nishioka | 349/21 |

OTHER PUBLICATIONS

Ulrick Mescheder et al., "Active Focusing Device Based on MOEMS Technology", MEMS, MOEMS, and Micromachining II, Proc. of SPIE vol. 6168, 618601, 12 pages.

Korth, H. E., "Laser-Scanning Exposure System with Active Focus control," IBM Technical Disclosure Bulletin, vol. 26, No. 9, Feb. 1984, XP000709512 ISSN: 0018-8689, 2 pages.

Netherlands Patent Office, Office Action dated Aug. 27, 2010, Application No. NO136358, NL2002016, 10 pages.

* cited by examiner

Primary Examiner — Hung Henry Nguyen
Assistant Examiner — Colin Kreutzer
(74) Attorney, Agent, or Firm — Haynes and Boone, LLP (57) ABSTRACT

Provided is an exposure apparatus including a variable focusing device. The variable focusing device may include a transparent membrane that may be deformed in the presence of an electric field. The deformation of the transparent membrane may allow the focus length of a radiation beam to be modified. In an embodiment, the variable focusing device may be modulated such that a radiation beam having a first focus length is provided for a first position on an exposure target and a radiation beam having a second focus length is provided for a second position on the exposure target. A method and computer-readable medium are also provided.

13 Claims, 4 Drawing Sheets

EXPOSURE APPARATUS AND METHOD FOR PHOTOLITHOGRAPHY PROCESS

BACKGROUND

The present disclosure relates generally to photolithography and, more particularly, to an exposure apparatus and method used in fabrication of a semiconductor device.

A scanner, also known as a step-and-scan system, is a type of exposure tool used in modern-day photolithography processes to fabricate semiconductor devices. A scanner provides for moving a substrate (e.g., a wafer) and reticle (commonly referred to as a "mask") with respect to one another while exposing photosensitive material present on the substrate. Conventional scanners, as well as other conventional exposure tools, are limited in that the exposure process is executed at a fixed focus length for a given exposure field. An exposure field includes an area of a substrate covered (e.g., exposed) by a single exposure or "shot." In contrast to this, today's semiconductor devices often include dramatic pattern density differences providing for great variations in feature height above the plane of the substrate. For example, a dual damascene process, a typical method of forming interconnects in a semiconductor device, provides a large step height difference that can result in a large intra-exposure field focus range. This intra-field focus range negatively impacts the depth-of-focus (DOF). A poor DOF provides for decreased resolution in the photolithography process.

As such, an improved exposure apparatus and method are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1b is a cross-sectional view illustrating an embodiment of a radiation beam produced by the exposure tool of FIG. 1a.

DETAILED DESCRIPTION

The present disclosure relates generally photolithography and more particularly, to an exposure process and system useful in semiconductor device fabrication. It is understood, however, that specific embodiments are provided as examples to teach the broader inventive concept, and one of ordinary skill in the art can easily apply the teaching of the present disclosure to other methods or apparatus. For example, though described herein as applicable to a photolithography system and method for fabrication of semiconductor devices on a substrate (e.g., a wafer), the present disclosure may be applied to other technologies using photolithography, such as printed circuit boards. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings.

Figure 1A:
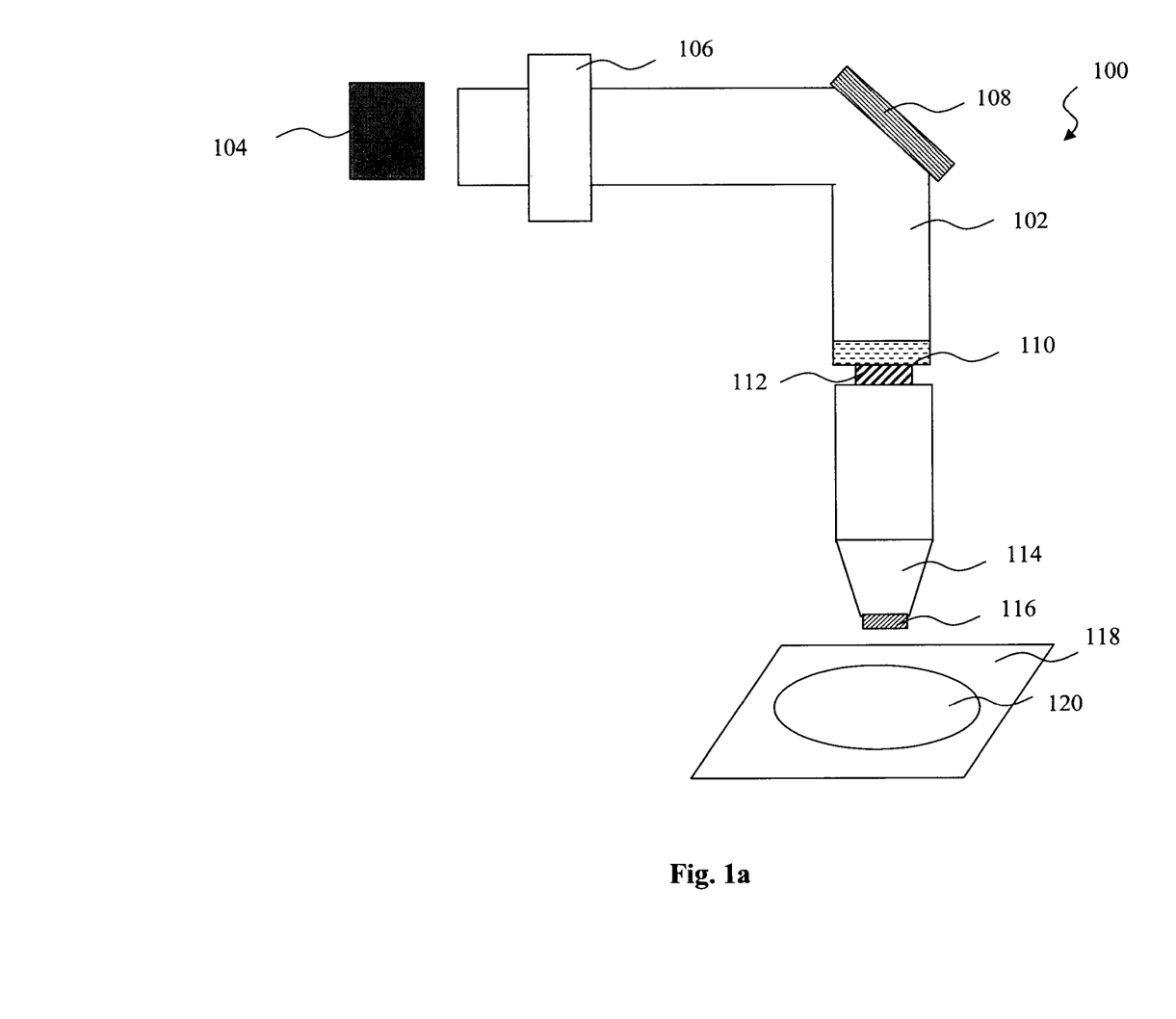
FIG. 1a is a schematic view illustrating an embodiment of an exposure apparatus.

Referring to FIG. 1, a schematic view of an embodiment of an exposure apparatus 100 is illustrated. The exposure apparatus 100 is illustrated in a simplified form to generally describe components and systems that are well known, and more specifically describe components and systems that are unique to the present embodiment. For example, the exposure apparatus 100 includes numerous lens, stages, mirrors, alignment systems, filters, and/or other systems and devices. The additional systems and/or devices may be included in, on, and/or adjacent to a projection system housing 102 of the exposure apparatus 100. The exposure apparatus 100 may be a stepper, a scanner, a step-and-scan system, an immersion lithography apparatus, and/or other apparatus capable of exposing a substrate to radiation. In a scan process, performed by a scanner or step-and-scan system, instead of exposing an entire exposure field at once, the exposure of the field is made through an exposure aperture, often referred to as a "slit."

The exposure apparatus 100 includes a radiation source 104 to provide a radiation beam (e.g., radiation energy). The radiation source 104 may be any suitable light source such as an ultra-violet (UV) source, a deep ultra-violent (DUV) source, or an extreme ultra-violet (EUV) source. For example, the radiation source 104 may be a mercury lamp, a Krypton Fluoride (KrF) excimer laser, an Argon Fluoride (ArF) excimer laser, a $F_2$ excimer laser, and/or other light sources. The radiation source 104 produces a radiation beam that is incident upon a substrate 120.

The exposure apparatus 100 includes the projection system housing 102 which may provide a mechanical housing though which a radiation beam generated by the radiation source 104 may travel. The projection system housing 102 includes a plurality components useful in performing an exposure process, including those illustrated and not illustrated, for example, lens, filters, reflectors (e.g., mirrors). The exposure apparatus 100, as depicted, includes a reflector, a mirror 108, for directing the path of a radiation beam originating from the radiation source 104 towards an exposure target (e.g., a substrate 120). The exposure apparatus 100 also includes an imaging lens device 114. The imaging lens device 114 may include a single lens or a plurality of lens elements configured to project the radiation beam onto the substrate 120. The imaging lens device 114 may provide for focus of the radiation beam in relation to the substrate 120.

A reticle (referred to herein as a mask) is used to provide a pattern to be exposed using the exposure apparatus 100. In the illustrated embodiment, a mask 110 is positioned in the exposure apparatus 100 when performing an exposure process. The mask 110 may include a transparent substrate including, for example, fused silica ($SiO_2$), borosilicate glass, or soda-lime glass. The mask 110 may include an absorption layer (e.g., a material providing for the absorption of radiation). The absorption layer may be formed of chromium (Cr), iron oxide, or an inorganic film including, for example, MoSi, ZrSiO, SiN, and/or TiN, and/or other radiation absorbing materials known in the art. The absorption layer is patterned to have one or more openings where a radiation beam may travel through the mask 110 without being significantly absorbed. The mask 110 also includes one or more absorption regions (e.g., regions where the absorption layer is present) where a radiation beam may be completely or partially absorbed and thereby blocked, in whole in or part, from traveling through the mask 110. As such, a radiation beam after traveling through the mask 110 includes a pattern in its cross-section as provided by the pattern of the absorption/non-absorption regions. The pattern may provide patterning of a layer of photosensitive material present on the substrate 120, as described below. The pattern may be used to fabricate one or more circuit features or portions thereof on the substrate 120. In an embodiment, the mask 110 includes a binary intensity mask (binary mask) having a pattern including chrome (e.g., absorption regions) and transparent regions. In other embodiments, the mask 110 may include an alternating phase shift mask (AltPSM), an attenuating phase shift mask (AttPSM), a chromeless phase lithography (CPL) mask, and/or other possible photomask technologies known in the art. The mask 110 may further comprise optical proximity correction features (OPC). The mask 110 may be positioned on a stage (not illustrated) such that it may moved to accommodate a scan function of the exposure apparatus 100.

The exposure apparatus 100 further includes a substrate stage 118 for holding, positioning, moving, and otherwise manipulating a substrate (e.g., wafer) 120. The substrate stage 118 may be positioned relative to the mask 110 such that the appropriate portion of the substrate 120, positioned on the substrate stage 118, is exposed to the appropriate pattern included on the mask 110. The substrate stage 118 may allow for a step-and-scan process. The substrate stage 118 may also operate to position the substrate 120 in a vertical direction, thus may change the relative distance from the substrate 120 to the imaging lens device 114 to provide proper exposure.

The substrate 120 may be a semiconductor substrate (e.g., wafer). The substrate 120 may include silicon, germanium, diamond, and/or a compound semiconductor materials. In other embodiments, the substrate 120 may include material such fused silicon or calcium fluoride for the formation of a photomask such as the mask 110, glass for a thin-film transistor liquid crystal display (TFT LCD) device, and/or other possible materials for which an exposure process is useful. The substrate 120 may include a plurality of features formed thereon including one or more patterned layers. In an embodiment, the substrate 120 includes an interconnect feature or portion thereof formed by a dual-damascene process. The substrate 120 may include layers and/or features, such as a dual damascene structure, that provide a varying topology of the substrate 120. A varying topology of the substrate provides different heights of features on the substrate as determined from a reference plane (e.g., different heights of the uppermost layer across the substrate 120 as determined from a reference plane). The height of an uppermost layer (or feature) at a position on the substrate 120 may be referred to herein as a level. The level may be determined by a level sensor as described in further detail below. A determination of plurality of levels for the substrate 120 provides a level sensor map (e.g., a denotation of a relative height of a substrate at two or more locations on the substrate).

The substrate 120 further includes a layer of photosensitive material to be exposed using the exposure apparatus 100. The photosensitive material may include a photoresist such as a chemical amplification resist (CAR). The substrate 120 includes multiple dies (e.g., integrated circuit devices). The substrate 120 also includes a plurality of exposure fields. An exposure field includes an area of the substrate 120 that is irradiated in a single exposure by the exposure apparatus 100. An exposure field may comprise one or more dies and/or portions thereof. The substrate 120 includes a matrix (e.g., columns and rows) of adjacent exposure fields. The matrix of exposure fields may provide overlap between adjacent exposure fields (e.g., a region of the substrate 120 may be included in more than one exposure field). The exposure apparatus 100 applies a radiation beam including a pattern in the beam's cross-section onto the surface of the substrate 120 and in particular onto the surface of the substrate 120 in an exposure field coated with a photosensitive material. The pattern may be defined by the mask 110.

Prior to the exposure process step, the substrate 120 may go through various other fabrication processes including forming a layer of photosensitive material on the substrate 120. The photosensitive material typically includes a layer of photoresist on the substrate. The forming of a photoresist layer on the substrate may be performed by a spin-on process, a deposition process, and/or other process for forming a layer known in the art. After forming the photoresist layer, the substrate 120 may be soft baked to evaporate solvents. The substrate 120 may then be transferred to the exposure apparatus 100 and in particular, to the substrate stage 118. After exposure, the substrate 120 may be subjected to further photolithography processing such as, a post exposure bake providing for polymer dissolution and subsequent development of the exposed pattern. The pattern may be used to form one or more features on the substrate such as, a gate feature, a source feature, a drain feature, an interconnect feature, an isolation feature, and/or other integrated circuit features known in the art. Such features may be formed using conventional fabrication method such as, ion implantation, diffusion, deposition, plating, etching, chemical mechanical polish, oxidation and/or other processes known in the art. The substrate 120 may be processed through a plurality of photolithography processes in forming a device on the substrate 120, during which the exposure apparatus 100 may perform an exposure process on the substrate 120 a plurality of times.

The exposure apparatus 100 also includes a level sensor 116. The level sensor 116 may provide a determination of a topology (e.g., level) of the substrate 120 or any portion thereof. The level sensor 116 may provide a determination of the relative height of the uppermost surface of the substrate 120 at one or more points on the substrate 120. In an embodiment, the level sensor 116 may determine the level at a plurality of points on the substrate 120 producing a level sensor map. The level sensor 116 may be operably coupled to a controller and the output of the level sensor 116 (e.g., the determined level or level sensor map) may be used by the controller to determine one or more process parameters for the exposure apparatus 100, as described in further detail with reference to FIG. 2. In an embodiment, the level sensor 116 measures the slope of the uppermost surface of the substrate 120. The level sensor 116 may include, for example, a radiation (e.g., light) source, a reflector (e.g., mirror), a detector, and/or other components known in the art.

Figure 1B:
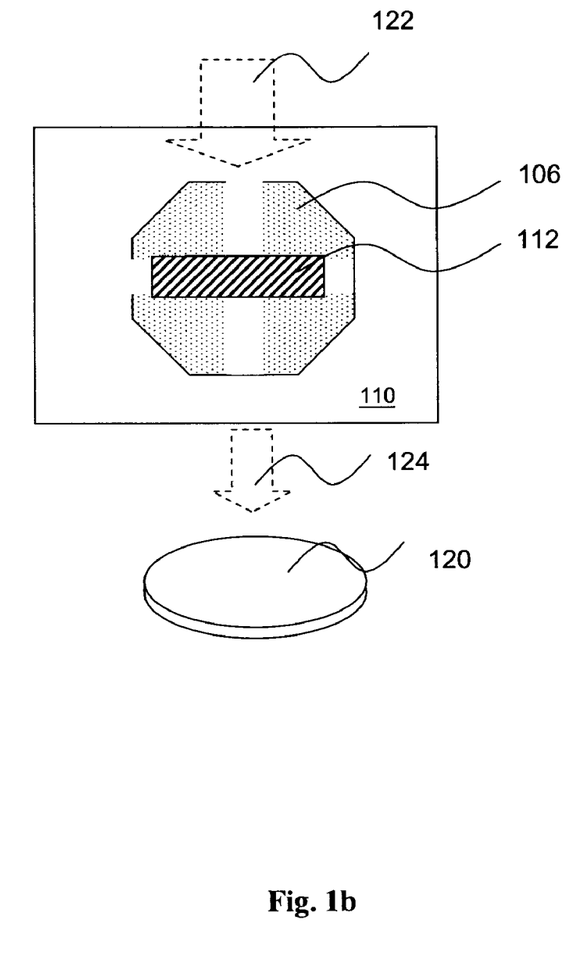

The exposure apparatus 100 also includes a reticle edge masking assembly (REMA) 106. The REMA 106 defines the area of the mask 110 to be illuminated during the exposure process by blocking portions of incident radiation, as illustrated by FIG. 1b. In an embodiment, the REMA 106 includes a plurality of blades which are orthogonally positioned and movable in order to define and opening for the radiation to pass.

The exposure apparatus 100 further includes a variable focusing device 112. The variable focusing device 112 provides for adjusting of the focus length provided by the exposure apparatus 100. In an embodiment, the variable focusing device 112 provides for adjusting the focus length during an exposure process. For example, in an embodiment, the variable focusing device 112 provides for a plurality of focus lengths to be used to expose the substrate 120. In an embodiment, the variable focusing device 112 provides for a plurality of focus lengths to be used to expose a single exposure field on the substrate 120. The variable focusing device 112 includes an adjustable transparent aperture. Radiation, such as a radiation beam from the radiation source 104, may pass through the adjustable transparent aperture. In an embodiment, the variable focusing device 112 is aligned such that its variable aperture controls the slit dimension of the exposure apparatus 100 in scan mode.

The variable focusing device 112, and in particular the transparent aperture, may include a transparent material including in liquid form or in solid form. In an embodiment, the transparent material forms a membrane. In an embodiment, the membrane includes silicon. In a further embodiment, the membrane includes crystalline silicon. The membrane may be electrostatically deformed. That is, an applied electric field may deform the membrane. When deformed, the membrane may provide a parabolic shaped surface. As such, the membrane may include any material operable to be parabolically deformed. The strength of the applied electric field may affect the extent of the deformation. The membrane may be such that when the electric field is removed, it returns to its original shape (e.g., the surface is substantially planar). The surface of the membrane acts as a lens to an incident radiation beam. Therefore, the deformation of the membrane provides for altering the focus length of an incident radiation beam. The deformable membrane may provide for a plurality of focus lengths depending the strength of the applied electric field. Thus, the deformable membrane provides for easy variation between a plurality of focus lengths simply by altering the applied electric field. The deformable membrane may be formed using a silicon-on-insulator (SOI) process.

The variable focusing device 112 is operably coupled to a controller (e.g., an integrated circuit (IC) controller). The controller is operable to alter or modulate an electric field applied to the variable focusing device 112. The electric field may be formed by applying a voltage between two electrodes coupled to a membrane of the variable focusing device 112. The controller may determine the voltage to be applied based upon the strength of the electric field required to provide the deformation that gives the desired focus length. The controller may provide for a first voltage and consequent electric field for a first position on the substrate 120 and provide for a second voltage and consequent electric field (distinct from the first) for a second position on the substrate 120. In an embodiment, the controller provides for different focus lengths to be provided by the variable focusing device 112 within a single exposure field for the substrate 120. In an embodiment, the controller is operably coupled to the level sensor 116 such that information may be received from the level sensor 116, for example, a level sensor map. The information from the level sensor map may be used to determine one or more required focus lengths for the exposure process, for example, as described below with reference to FIG. 2.

The variable focusing device 112 membrane may include a micro-machined membrane. In an embodiment, the variable focusing device 112 may be a micro-electro-mechanical (MEMS) device. In a further embodiment, the variable focusing device 112 may be a micro-opto-electro-mechanical (MOEMS) device. One such MOEMS device is described in "Active focusing device based on MOEMS technology" by Mescheder et al., SPIE Vol. 6186 (2006), which is herein incorporated by reference.

Referring now to FIG. 1*b*, illustrated in cross-section is a radiation beam 124 incident on a substrate having traveled through an exposure apparatus, such as the exposure apparatus 100, of FIG. 1*a*. A radiation beam 122 may be generated by the radiation source 104, described in further detail above. The radiation beam 122 may be a UV radiation beam, DUV radiation beam, an EUV beam, and/or any other radiation type known in the art. The radiation beam 122, as illustrated in FIG. 1*b*, forms the radiation beam 124 that is incident upon the substrate 120. The radiation beam 124 includes the radiation beam 122 having passed through one or more devices of the an exposure apparatus; the devices provide for absorption or reflection of a portion of the radiation beam 124. The radiation beam 124 is defined by the REMA 106, the mask 110, and the variable focusing device 112, all described in further detail with reference to FIG. 1*a*. The resultant beam, radiation beam 124 defines an exposure field or portion thereof that is incident upon the exposure target (e.g., the substrate 120).

A portion of the radiation beam 122 is blocked (e.g., completely or partially absorbed) by the REMA 106 which blocks areas of the mask 110 that are not intended to be exposed. The REMA 106 may define an area of the mask 110 that is to be illuminated and is positioned prior to the mask 110 as the radiation beam 122 travels from a radiation source, for example as illustrated in FIG. 1*a*. In an embodiment, the REMA 106 may be placed nearly adjacent to the mask 110 (not illustrated). The REMA 106 includes adjustments that provide for moving the absorbing portion (e.g., blades) of the REMA 106 (e.g., adjusting the areas blocking radiation which are illustrated by shaded areas in the FIG. 1*b*). The REMA 106 thus may define the shape of the radiation beam 122. The radiation beam 122 then travels through the mask 110 where a pattern is defined in the cross-section of the radiation beam 122, as described above in further detail with reference to FIG. 1*a*.

After passing through the mask 110, the radiation beam 122 is incident upon the variable focusing device 112. The variable focusing device 112 may adjust the focus length of the radiation beam 122 using a deformable transparent membrane included in the variable focusing device 112, as described in detail with reference to FIG. 1*a*. Though illustrated in cross-hatch as encompassing the horizontal direction (e.g., slit). In an embodiment, the variable focusing device 112 includes a transparent membrane that allows a variable portion of the radiation to travel through to the wafer in the horizontal direction (e.g., slit). Thus the radiation beam 124 has been defined by at least the REMA 106, the mask 110, and the variable focusing device 112 before being projected onto the substrate 120. The radiation beam 122 and/or the radiation beam 124 may pass through a plurality of filters, lens, and/or other devices known in the art that further define the beam's shape, pattern, composition, focus, and/or other attributes.

Figure 2:
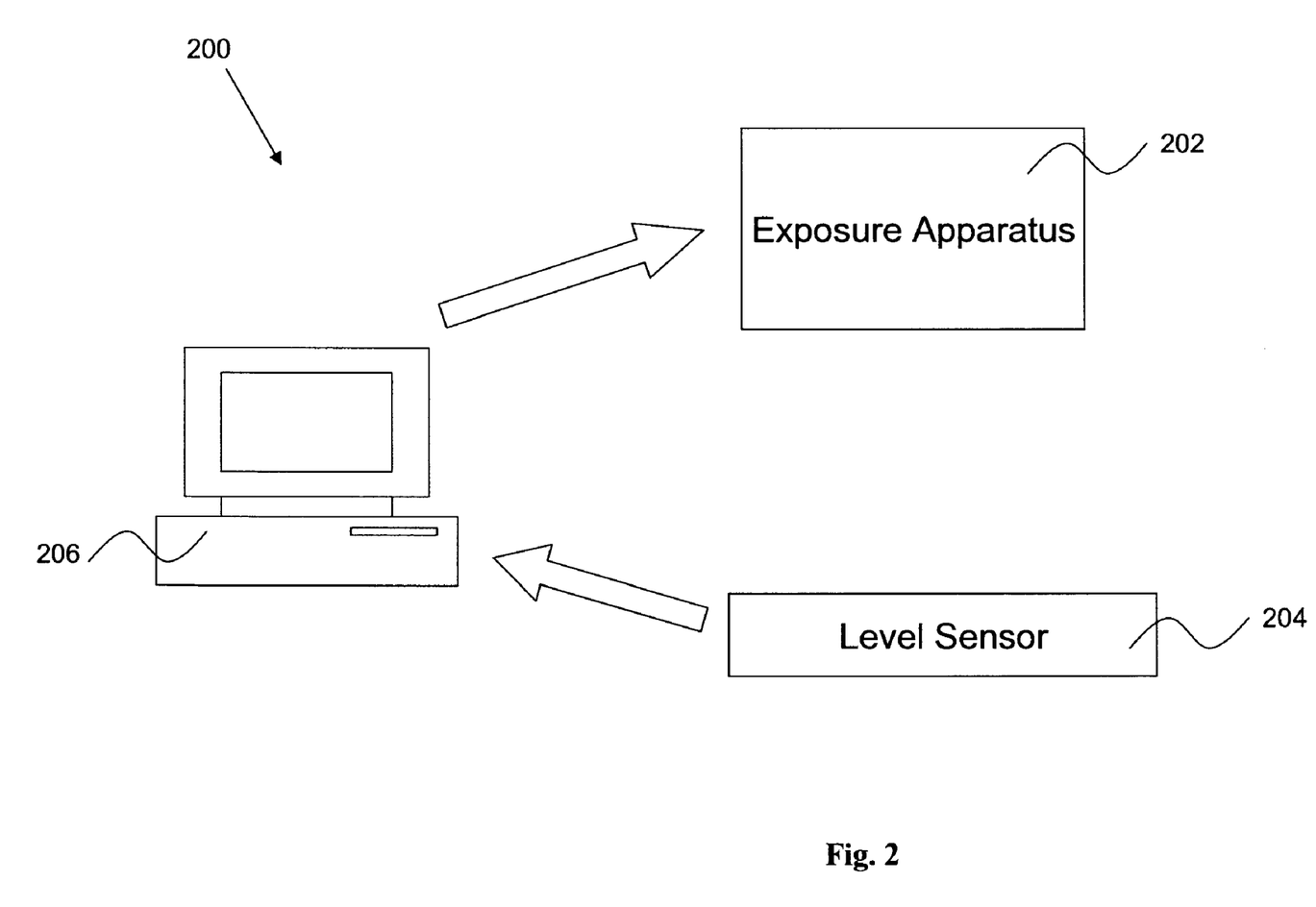
FIG. 2 is a block diagram illustrating an embodiment of an exposure system.

Referring now to FIG. 2, a block diagram illustrating an embodiment of an exposure process system 200 is illustrated. The exposure process system 200 may be used to provide process control to improve an exposure quality. In an embodiment, the system 200 may be used to provide for improved intra-field focus range. The system 200 allows a focus length to be adjusted locally to compensate for topology differences on the target area (e.g., the exposure field) of the substrate. This is in contrast to a conventional exposure process which is executed at a fixed focus length. The system 200 includes an exposure apparatus 202, a level sensor 204, and a computer 206 and depicts a plurality of arrows illustrating information flow. Though illustrated as distinct units, the level sensor 204 may be included in the exposure apparatus 202. Likewise, the computer 206 may be software and/or hardware included in the exposure apparatus 202 and/or the level sensor 204. The exposure apparatus 202 may be substantially similar to the exposure apparatus 100, described in detail above with reference to FIG. 1a. The level sensor 204 may be substantially similar to the level sensor 116, also described above with reference to FIG. 1a.

The level sensor 204 is operably coupled to the computer 206 such that information may be transferred between the level sensor 204 and the computer 206. The information transferred may include one or more determinations of a topology of a substrate (e.g., a level sensor map). The level sensor map may include a level (e.g., a height in relation to a plane) of one or more points on a substrate. In an embodiment, a level sensor map may include a plurality of levels each corresponding to a point on a single exposure field of a substrate.

The computer 206 is an information handling system which is capable of processing, executing, or otherwise handling information. The computer 206 includes computer readable medium to store functional descriptive material (e.g., software or data structures). Such functional descriptive material imparts functionality when encoded on the computer readable medium. The computer 206 may also include a processor for processing and otherwise manipulating received and/or stored data. The computer 206 may include a controller having functionality such as described above with reference to the controller of the variable focusing device 112 of FIGS. 1a and 1b.

In an embodiment, the computer 206 determines a compensation map based on a received level sensor map. The compensation map may include a determination of one or more parameters to be used in the exposure process for the substrate. The parameters may compensate in whole or in part, for the topography differences determined and provided for in the level sensor map. In an embodiment, the compensation map provides one or more parameters to be used for an exposure process for each of a plurality of points on a substrate. For example, in an embodiment, the compensation map specifies a first focus length to be applied to expose a first area of the substrate and a second focus length to be applied to expose a second area of the substrate. In an embodiment, the first area and the second area of the substrate are within a single exposure field. In an embodiment, the compensation map further provides for a strength of an electric field to apply to a variable focusing device included in the exposure apparatus 202 corresponding to the desired focus length for the location on the substrate. The variable focusing device may be substantially similar to the variable focusing device 112, described above with reference to FIGS. 1a and 1b. The computer 206 may include, or be operably coupled to, a controller operable to apply a determined electric field (e.g., supplying a voltage), such as provided by the compensation map, to the variable focusing device 112.

As an example, in an embodiment, a substrate, such as the substrate 120 described above with reference to FIGS. 1a and 1b, is provided. The level sensor 204 determines one or more levels of the substrate, generating a level sensor map. In particular, the level sensor map provides for at least one position, referred to for purposes of this example as a first location, on a substrate determining a level (e.g., height), referred to as a first level. The first level may be such that it is outside a typical depth of focus of the exposure apparatus 202. The level sensor map is communicated to the computer 206. A compensation map may be generated by the computer 206 that determines a modified focus length to be provided by the exposure apparatus 202 when exposing the first location. This modified focus length may provide for proper exposure of the first location such that it is within a DOF. The compensation map may further include a plurality modified focus lengths each corresponding to a position on the wafer for which the level sensor has provided a level. The computer 206 then determines a strength of electric field and/or voltage to be applied to a variable focusing device of the exposure apparatus 202 to provide the modified focus length. The electric field is then applied to the variable focusing device of the exposure apparatus 202 and the first location is exposed using a radiation beam having a focus length determined by the variable focusing device. Thus, the system 200 provides for a system and method of feed-forward process control by using information (e.g., level sensor map) to provide for determining a focus length provided by the exposure apparatus 202 prior to exposure. The focus length provided by the exposure apparatus 202 (e.g., the variable focusing device) may be adjusted by modulating an electric field applied to a variable focusing device to provide exposure at a given focus length in a local area on a substrate using feed-forward information. Furthermore, the focus length provided by the exposure apparatus 202 (e.g., the variable focusing device) may be adjusted by modulating an electric field applied to a variable focusing device to provide exposure of a plurality of points on the substrate each at a different focus length.

In an embodiment, the computer 206 provides other parameters to compensate for the level sensor map for example, adjusting the distance between the wafer and a lens of the exposure and/or adjusting a REMA of the exposure tool such as, the REMA 106. In other embodiments, the computer 206 receives information from other sources in lieu of or in addition to information from the level sensor 204. This information may also be used to determine a required modulation (e.g., adjustment) of the variable focusing device and may include information associated with any focus fluctuation source, for example, in the exposure apparatus 202 or a mask used in the exposure process.

Figure 3:
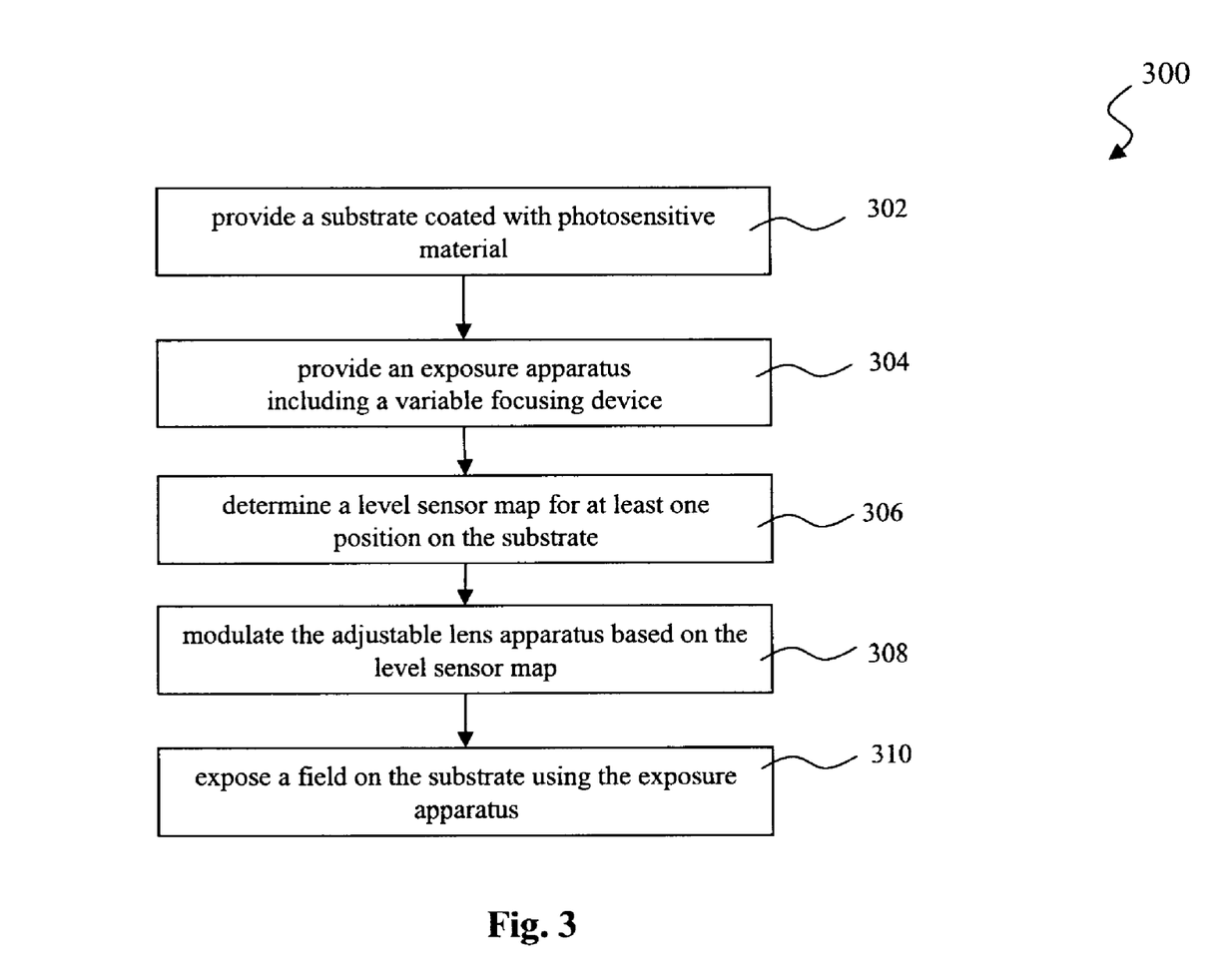
FIG. 3 is a flowchart illustrating an embodiment of a method of photolithography.

Referring now to FIG. 3, a method of performing a photolithography process is provided. The method 300 includes an exposure process employed in a photolithography process. The method 300 begins at step 302 where a substrate coated with photosensitive material is provided. The substrate provided may be substantially similar to the substrate 120, described above with reference to FIG. 1a. The photosensitive material (e.g., photoresist) present on the substrate may be formed using a spin-on process, a deposition process, and/or formed by the other processes known in the art. The photoresist may include positive-type or negative-type photoresist. One or more layers and/or features may be present on the substrate in addition to the photoresist layer, including underlying the photoresist layer. After forming the photoresist layer, the substrate may be baked in preparation for the exposure process.

The method 300 then proceeds to step 304 where an exposure apparatus including an variable focusing device is provided. The exposure apparatus provided may be substantially similar to the exposure apparatus 100 and/or the exposure apparatus 202, described above with reference to FIGS. 1a and 2. The variable focusing device may be substantially similar to the variable focusing device 112, described above with reference to FIGS. 1a and 1b. The exposure apparatus may include a staging platform on which the substrate, provided above in reference to step 302, is placed. The staging platform may be substantially similar to the substrate stage 118, also described above with reference to FIG. 1a.

The method 300 then proceeds to step 306 where a level sensor map including a determination of a level (e.g., height from a reference plane) of an uppermost feature (e.g., layer) for at least one point on the substrate. In an embodiment, a level or height of the uppermost feature is determined for a plurality of positions within an exposure field. The level sensor map may be generated by a level sensor such as the level sensor 116, described above with reference to FIG. 1*a*, and/or the level sensor 204, described above with reference to FIG. 2.

The method 300 then proceeds to step 308 where the variable focusing device is modulated to provide an appropriate focus length for the exposure process. The modulation of the variable focusing device provides for a variation in the focus length provided by the variable focusing device and therefore the exposure apparatus. The required adjustments to the focus lengths are determined using the level sensor map, described above with reference to step 306. In an embodiment, a compensation map is generated providing a determination of a needed compensation of the focus length from a reference plane at a plurality of points on the substrate. The variable focusing device may be modulated to provide for the needed compensation, in whole or in part. The variable focusing device may be modulated by exposing a deformable membrane included in the variable focusing device to an electric field of a determined strength as is provided in greater detail above with reference to the variable focusing device 112 illustrated in FIG. 1*a*.

The method 300 then proceeds to step 310 where a field is exposed on the substrate. In an embodiment, the field is exposed using a scanning exposure process. The radiation beam incident on the substrate exposes a pattern of a circuit feature or portion thereof in the exposure field (e.g., portion of substrate exposed to radiation). The exposure field may be defined in part by the variable focusing device. In particular, the focus length of the radiation beam incident on the substrate and providing the exposure field is defined in part by the variable focusing device. The variable focusing device may allow the focus length of a radiation beam of an exposure apparatus to be adjusted during the exposure process. For example, in an embodiment, the variable focusing device provides one or more different focus lengths within an exposure process for a given substrate. In an embodiment, the variable focusing device allows providing one or more different focus lengths within an exposure process for a given exposure field on a substrate. The variable focusing device may also be modulated based upon the presence of a given feature in the exposure field such as, a dual-damascene interconnect structure.

Thus, the method 300 provides adjustable focus length within an exposure process. Though described herein as adjustable focus in response to a determination by a level sensor of the topology of a substrate, an embodiment of the method 300 including use of a variable focusing device may provide adjustable focus in response to other parameters. In an embodiment, the topology of a substrate may be determined by means other than a level sensor. The adjustable focus may be useful for compensating for any parameter that may affect the focus range of an exposure apparatus and/or process including those resulting from the mask, lens, or other components of the exposure apparatus and/or exposure process. Furthermore, the method 300 may include adjusting the focus length provided by an exposure apparatus in additional manners, such as in adjustment of positioning of a substrate.

Thus, the present disclosure provides an apparatus. The apparatus includes a radiation source operable to provide a radiation beam. Also included is a variable focusing device. The variable focusing device comprises a membrane. In an embodiment, the membrane is deformable when an electric field is provided to it. In an embodiment, the deformed membrane alters the focus length of a radiation beam passing through the membrane. The apparatus also includes a controller operably coupled to the variable focusing device and a substrate stage providing for positioning a semiconductor substrate.

Also provided is a computer readable medium comprising instructions. The instructions include providing for receiving at least one determination of a level on a semiconductor substrate. The level includes a height of a first feature above a reference plane. The instructions further provide for determining a focus length to be used to expose the first feature. Also provided for is determining a modulation of a membrane to provide the determined focus length.

Further provided is a method of photolithography. The method includes providing a radiation beam. Also provided for is deforming a transparent membrane. In an embodiment, the membrane may be deformed by applying an electric field to the membrane. The radiation beam is passed through the deformed membrane. Passing through the deformed membrane may alter the focus length of the radiation beam. The substrate is then exposed to the radiation beam to form a pattern of a portion of a circuit feature on the substrate. In an embodiment, the method may include receiving a first level of the substrate to be exposed and deforming the membrane to provide an appropriate focus length to expose the first level. In an embodiment, the method may also include receiving a second level of the substrate, in addition to the first level, to be exposed and deforming the membrane to provide an appropriate focus length to expose the second level. In an embodiment, the first and second level are included in the same exposure field. Thus, in an embodiment, the method may provide for improved intra-exposure field focus.

Although only a few exemplary embodiments of this invention have been described in detail above, those skilled in the art will readily appreciate that many modifications are possible in the exemplary embodiments without material departing from the novel teachings and advantages of this disclosure.

What is claimed is:

1. An apparatus, comprising:
 a radiation source, operable to provide a radiation beam to expose a semiconductor substrate;
 a level sensor for identifying a height of a feature on the substrate and providing an indication of a first height and an indication of a second height to a controller, wherein the first and second height are in a single exposure field of the substrate;
 a variable focusing device, wherein the variable focusing device comprises a membrane and is configured to provide a first focus length when a first electric field is applied to the membrane and provide a second focus length with a second electric field is applied to the membrane;
 the controller operably coupled to the variable focusing device and configured to control the variable focusing device by providing both the first electric field and the second electric field separately while exposing a single exposure field of the substrate, during a step-and-scan process, wherein the first electric field is provided in response to the indication of the first height from the level sensor and the second electric field is provided in response to the indication of the second height from the level sensor; and
 a substrate stage providing for positioning the semiconductor substrate for a step-and-scan process.

2. The apparatus of claim 1, wherein the membrane includes at least one of a transparent solid material and a transparent liquid material.

3. The apparatus of claim 1, further comprising:

a photomask including a pattern for forming a portion of a circuit, wherein the photomask is located between the radiation source and the variable focusing device.

4. The apparatus of claim 1, wherein the membrane comprises silicon.

5. The apparatus of claim 1, wherein the variable focusing device is a micro-opto-electro-mechanical (MOEMS) device.

6. The apparatus of claim 1, wherein at least one of the first and second focus length are based on a presence of a semiconductor feature.

7. A non-transitory computer readable medium, comprising computer-readable instructions to determine a photolithography parameter, the computer-readable instructions comprising instructions to:
  receive a first determination of a first level on a semiconductor substrate, wherein the first level includes a height of a first feature above a reference plane; and
  receive a second determination of a second level on the semiconductor substrate, wherein the second level includes a height of a second feature above a reference plane, wherein the first and second feature are in a single exposure field;
  creating a compensation map based on the received first and second determinations, wherein the compensation map includes a first focus length to be used to expose the first feature and a second focus length to be used to expose a second feature, wherein the first feature and the second feature are in the same exposure field;
  determining a first modulation of a membrane to provide the determined first focus length; and
  determining a second modulation of a membrane to provide the determined second focus length; wherein at least one of the first modulation of the membrane and the second modulation of the membrane is based upon a presence of a semiconductor device feature.

8. The non-transitory medium of claim 7, wherein the determining the first and second modulation of the membrane includes determining a first and second electric field to be applied to the membrane.

9. The non-transitory medium of claim 7, wherein the semiconductor device feature is a dual-damascene interconnect structure.

10. A method of photolithography, including:
  providing a radiation beam, wherein the radiation beam is provided as a shot of a step-and-scan process;
  determining a first level of the substrate and a second level of the substrate using a level sensor, wherein the first and second levels are a single exposure field;
  determining a first focus length for exposing the substrate using the determined first level and determining a second focus length for exposing the substrate using the determined second level;
  deforming a transparent membrane, thereby providing a first deformed membrane;
  passing the provided radiation beam through the first deformed membrane to provide the first focus length;
  exposing a substrate to the radiation beam, after the radiation beam has passed through the first deformed membrane, wherein the exposing the substrate includes forming a pattern including a portion of a circuit feature on the substrate;
  thereafter, deforming the transparent membrane, thereby providing a second deformed membrane to provide the second focus length;
  passing the provided radiation beam through the second deformed membrane; and
  exposing the substrate to the radiation beam after the radiation beam has passed through the second deformed membrane, wherein the exposing the substrate to the radiation beam after the radiation beam has passed through the first deformed membrane and the exposing the substrate to the radiation beam after the radiation beam has passed through the second deformed membrane is performed in a single exposure field;
  wherein a plurality of shots of the step-and-scan process are used to expose a horizontal path across of the substrate.

11. The method of claim 10, wherein the deforming the transparent membrane including providing an electric field to the membrane.

12. The method of claim 11, further comprising:
  determining the strength of the provided electric field using a determination of a uppermost level of the portion of the circuit feature on the substrate.

13. The method of claim 10, wherein the deforming the transparent membrane includes parabolically deforming a membrane comprising silicon.

* * * * *